United States Patent
Loopstra et al.

(12) 
(10) Patent No.: US 6,337,484 B1
(45) Date of Patent: Jan. 8, 2002

(54) POSITIONING DEVICE AND LITHOGRAPHIC PROJECTION APPARATUS COMPRISING SUCH A DEVICE

(75) Inventors: Erik Roelof Loopstra, Heeze; Adrianus Gerardus Bouwer, Nuenen; Henricus W. A. Janssen, Eindhoven; Harmen Klaas Van Der Schoot, Vught, all of (NL)

(73) Assignee: ASM Lithography, B.V., Veldhoven (NL)

( * ) Notice: Subject to any disclaimer, the term of this patent is extended or adjusted under 35 U.S.C. 154(b) by 0 days.

(21) Appl. No.: 09/353,664

(22) Filed: Jul. 15, 1999

(30) Foreign Application Priority Data

Jul. 17, 1998 (EP) .............................................. 98202206

(51) Int. Cl.⁷ .............................................. G03B 27/58
(52) U.S. Cl. .............................. 250/442.11; 250/492.2; 250/453.11; 355/53; 355/72; 355/75
(58) Field of Search .................. 250/492.2, 453.11, 250/442.11; 355/53, 72, 75

(56) References Cited

U.S. PATENT DOCUMENTS 5,767,948 A * 6/1998 Loopstra et al. ............... 355/53
5,953,105 A * 9/1999 Van Engelen et al. ........ 355/53

* cited by examiner

Primary Examiner—Bruce Anderson
Assistant Examiner—Nikita Wells
(74) Attorney, Agent, or Firm—Pillsbury Winthrop LLP

(57) ABSTRACT

A positioning device comprising a first part and a second part which is displaceable relative to the first part by means of a system of Lorentz-force motors, whereby, relative to the first part, the second part is supported in a Z-direction by means of at least one gas cylinder, said gas cylinder comprising a housing having a pressure chamber, which housing is coupled to the first part; and a piston which is coupled to the second part and which can be displaced in the pressure chamber in the Z-direction, said piston being journaled relative to said housing substantially at right angles to the Z-direction.

13 Claims, 9 Drawing Sheets

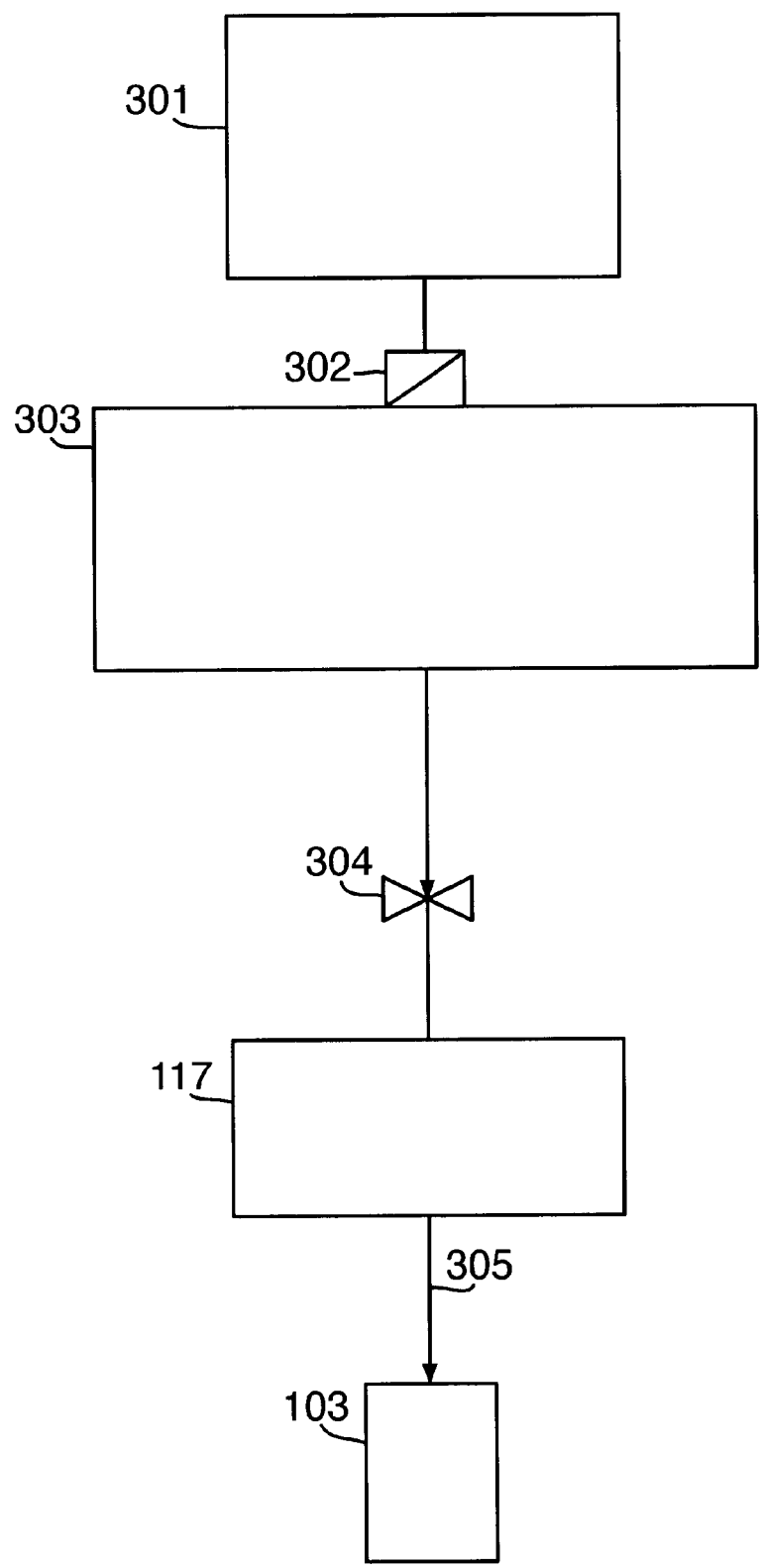

POSITIONING DEVICE AND LITHOGRAPHIC PROJECTION APPARATUS COMPRISING SUCH A DEVICE

BACKGROUND OF THE INVENTION

1. Field of the Invention

The present invention relates to a positioning device, and more particularly to such a device included in a lithographic projection apparatus.

2. Description of Related Art

For the sake of simplicity, the projection system may hereinafter be referred to as the "lens"; however, this term should be broadly interpreted as encompassing various types of projection system, including refractive optics, reflective optics, catadioptric systems, and charged particle optics, for example. The projection system may include elements operating according to any of these principles for directing, shaping or controlling the projection beam of radiation, and such elements may also be referred to below, collectively or singularly, as a lens. In addition, the first and second object tables may be referred to as the "mask table" and the "substrate table", respectively. Further, the lithographic apparatus may be of a type having two or more mask tables and/or two or more substrate tables. In such multiple stage devices, the additional tables may be used in parallel, or preparatory steps may be carried out on one or more stages while one or more other stages are being used for exposures. Twin stage lithographic apparatuses are described in International Patent Applications WO 98/28665 and WO 98/40791, for example.

Lithographic projection apparatuses can be used, for example, in the manufacture of integrated circuits (ICs). In such a case, the mask (reticle) may contain a circuit pattern corresponding to an individual layer of the IC, and this pattern can be imaged onto a target area (die) on a substrate (silicon wafer) which has been coated with a layer of photosensitive material (resist). In general, a single wafer will contain a whole network of adjacent dies that are successively irradiated via the reticle, one at a time. In one type of lithographic projection apparatus, each die is irradiated by exposing the entire reticle pattern onto the die in one go; such an apparatus is commonly referred to as a wafer stepper. In an alternative apparatus, which is commonly referred to as a step-and-scan apparatus, each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally<1), the speed v at which the wafer table is scanned will be a factor M times that at which the reticle table is scanned. More information with regard to lithographic devices as here described can be gleaned from International Patent Application WO 97/33205.

Lithographic apparatuses may employ various types of projection radiation, such as ultra-violet light (UV), extreme UV, X-rays, ion beams or electron beams, for example. Depending on the type of radiation used and the particular design requirements of the apparatus, the projection system may be refractive, reflective or catadioptric, for example, and may comprise vitreous components, grazing-incidence mirrors, selective multi-layer coatings, magnetic and/or electrostatic field lenses, etc. The apparatus may comprise components that are operated in vacuum, and are correspondingly vacuum-compatible. As mentioned above, the apparatus may have more than one substrate table and/or mask table.

A positioning device using Lorentz-motors is known from EP-B-0 342 639. The first part of the known positioning device comprises a slide that, by means of a system of servomotors, can be displaced with relatively low accuracy over relatively large distances in the X- and Y-directions. The second part comprises a substrate holder that, by means of a system of Lorentz-force motors, can be displaced relative to the first part with relatively high accuracy over relatively small distances with six mutually independent degrees of freedom. By using the system of Lorentz-force motors, mechanical contacts between the first part and the second part, and transmission of mechanical vibrations from the first part to the second part, are limited. This results in a high positioning accuracy of the known positioning device. An embodiment of the known positioning device comprises a further system of permanent magnets which exerts a supporting force on the second part in a direction parallel to the vertical Z-direction. This avoids the need to support the second part in the vertical Z-direction by Lorentz forces generated by the system of Lorentz-force motors, which would lead to a high energy dissipation in the coils of the Lorentz-force motors. Consequently, the Lorentz-force motors are used only to generate displacements of the second part, so that the energy dissipation of the electric coils of the Lorentz-force motors is considerably reduced.

A drawback of the known positioning device is that the magnitude of the supporting force of the further system of permanent magnets changes substantially if the distance between the first part and the second part changes in the Z-direction, so that the further system of permanent magnets has a substantial magnetic stiffness in the Z-direction. As a result of this stiffness, a mass spring system formed by the further system of permanent magnets and the displaceable mass of the second part exhibits a rather high natural frequency in the Z-direction, resulting in a substantial transmission of mechanical vibrations from the first part to the second part. This adversely affects the positioning accuracy of the known positioning device.

SUMMARY OF THE INVENTION

It is an object of the invention to provide a positioning device in which the above-described drawback of the known positioning device is alleviated.

The present invention relates to a positioning device comprising a first part and a second part that is displaceable relative to the first part by means of a system of Lorentz-force motors. More particularly, the invention relates to such a device comprised in a lithographic projection apparatus comprising a radiation system for supplying a projection beam of radiation; a first movable object table provided with a mask holder for holding a mask; a second movable object table provided with a substrate holder for holding a substrate; and a projection system for imaging an irradiated portion of the mask onto a target portion of the substrate.

According to the present invention, there is provided: a positioning device comprising a first part and a second part which is displaceable relative to the first part by means of a system of Lorentz-force motors, characterized in that, relative to the first part, the second part is supported in a Z-direction by means of at least one gas cylinder, said gas cylinder comprising a housing having a pressure chamber, which housing is coupled to the first part; and a piston which is coupled to the second part and which can be displaced in the pressure chamber in the Z-direction, said piston being journaled relative to said housing at right angles to the Z-direction.

A gas cylinder as here referred to is sometimes also referred to as a (frictionless) pneumatic cylinder. By using the gas cylinder in the manner described above, the second part is supported relative to the first part by a pneumatic supporting force that is determined by gas pressure present in the pressure chamber. By a suitable choice of supply pressure and area of the piston, it is achieved that the pneumatic supporting force of the gas cylinder remains substantially constant when the piston is moved in the Z-direction. Since the piston is journaled perpendicularly to the Z-direction relative to the housing of the gas cylinder, e.g. by means of a static gas bearing, the piston can be displaced in the Z-direction substantially without friction, so that the relatively constant supporting force of the gas cylinder is substantially uninfluenced by the frictional forces of the static gas bearing exerted on the piston.

In the invention, the gas cylinder, acting as a gravity compensator, functions by providing compressed gas (e.g. air) which acts upon a cross section of a moving piston with a fixed projected area in the vertical (or other intended) direction. This area can be provided by a single physical surface, but can also be distributed over a number of physical surfaces, or even be a differential area between two opposing surfaces. The counterbalance force provided by the pressure acting on this area should remain as near constant as possible, both in magnitude and direction, irrespective of horizontal, vertical, pitch, yaw or roll motion of the supported part (e.g. mask or substrate holder), and its point of application should also remain static relative to the supportive part.

In a particular embodiment of a positioning device in accordance with the invention, the second part is supported relative to the piston in the Z-direction by a further static gas bearing, by means of which the second part is guided over a supporting surface of the piston so as to be displaceable at right angles to the Z-direction. By using the further static gas bearing, the second part can be displaced perpendicularly to the Z-direction substantially without friction over the supporting surface of the piston.

In another embodiment of a positioning device in accordance with the invention, the positioning device is provided with an intermediate part which is secured by means of an elastically deformable connecting member to the second part and bears on the supporting surface of the piston via the said further static gas bearing, the connecting member being substantially undeformable in the Z-direction but bendable about two mutually perpendicular bending axes perpendicular to the Z-direction. By using the intermediate part, the second part has freedom of rotation, relative to the first part, about the first axis of rotation and the second axis of rotation.

Optionally in accordance with the invention, the positioning device comprises an intermediate part that is provided with the supporting surface and is supported relative to the piston by means of a (substantially) spherical, static gas bearing in the Z-direction. By using the intermediate part and the spherical static gas bearing, the second part has freedom of rotation, relative to the first part, about the first and the second axes of rotation. The frictionless nature of the spherical gas bearing allows the second part to pitch and roll freely without influence from the gas cylinder.

Also optionally in accordance with the invention, the positioning device is provided with three gas cylinders and three Z-Lorentz-force motors belonging to a system of Lorentz-force motors, each of the Z-Lorentz-force motors exerting, in operation, a substantially dynamic Lorentz force on the second part in the Z-direction, in parallel with the substantially static force provided by the gas cylinder. The three gas cylinders provide, in the Z-direction, a stable and statically determined support of the second part relative to the first part, e.g. against gravitational acceleration. By means of the three Z-Lorentz-force motors, the second part can be displaced relative to the first part in the Z-direction, and rotated about the first axis of rotation and the second axis of rotation. Since each of the gas cylinders can be incorporated as part of the Z-Lorentz-force motor, a practical and compact construction of the positioning device is obtained.

In yet another embodiment of a positioning device in accordance with the invention, the first part can be displaced relative to a base of the positioning device, at least in the X-direction, by means of a drive unit of the positioning device. In this embodiment, the first part can be displaced relative to the base of the positioning device over relatively large distances with relatively low accuracy by means of said drive unit, while the second part can be displaced with relatively high accuracy over relatively small distances relative to the first part by means of the system of Lorentz-force motors. As a result, the drive unit, which must have relatively large dimensions, may be of a relatively simple type with a relatively small positioning accuracy, while the dimensions of the relatively accurate Lorentz-force motors can be limited.

In a lithographic apparatus according to the invention, at least one of the object tables includes a positioning device as described above, the substrate or mask holder being secured to the second part of the positioning device. The favorable properties of the positioning device in accordance with the invention manifest themselves in a particular way in the lithographic device in accordance with the invention in that transmission of mechanical vibrations to the substrate or mask holder is precluded as much as possible. This has a favorable effect on the accuracy with which the substrate or mask holder can be positioned relative to the projection system, and on the accuracy with which the pattern or sub-pattern on the mask is imaged onto the substrate.

According to a further aspect of the invention there is provided a method of manufacturing a device using a lithographic projection apparatus comprising a radiation system for supplying a projection beam of radiation; a first movable object table provided with a mask holder for holding a mask; a second movable object table provided with substrate holder for holding a substrate; and a projection system for imaging irradiated portions of the mask on to target portions of a substrate; the method comprising the steps of: providing a substrate that is at least partially covered by a layer of radiation-sensitive material; providing a mask that contains a pattern; projecting an image of at least part of the mask pattern onto a target area of the layer of radiation sensitive material; characterized in that, during said step of projecting an image, at least one of the mask and the substrate is positioned using a positioning device according to any one of claims 1 to 10.

In a manufacturing process using a lithographic projection apparatus according to the invention, a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC.

Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

In the present document, the terms "radiation" and "projection beam" are used to encompass all types of electromagnetic radiation or particle flux, including, but not limited to, ultraviolet radiation, EUV, X-rays, electrons and ions.

BRIEF DESCRIPTION OF THE DRAWINGS

The present invention will be described below with reference to exemplary embodiments and the accompanying schematic drawings, in which:

FIG. 9 is a diagram of a gas supply system usable in embodiments of the invention.

In the various drawings, like parts are identified by like reference numerals.

DETAILED DESCRIPTION OF THE PREFERRED EMBODIMENTS

Embodiment 1

Figure 1:
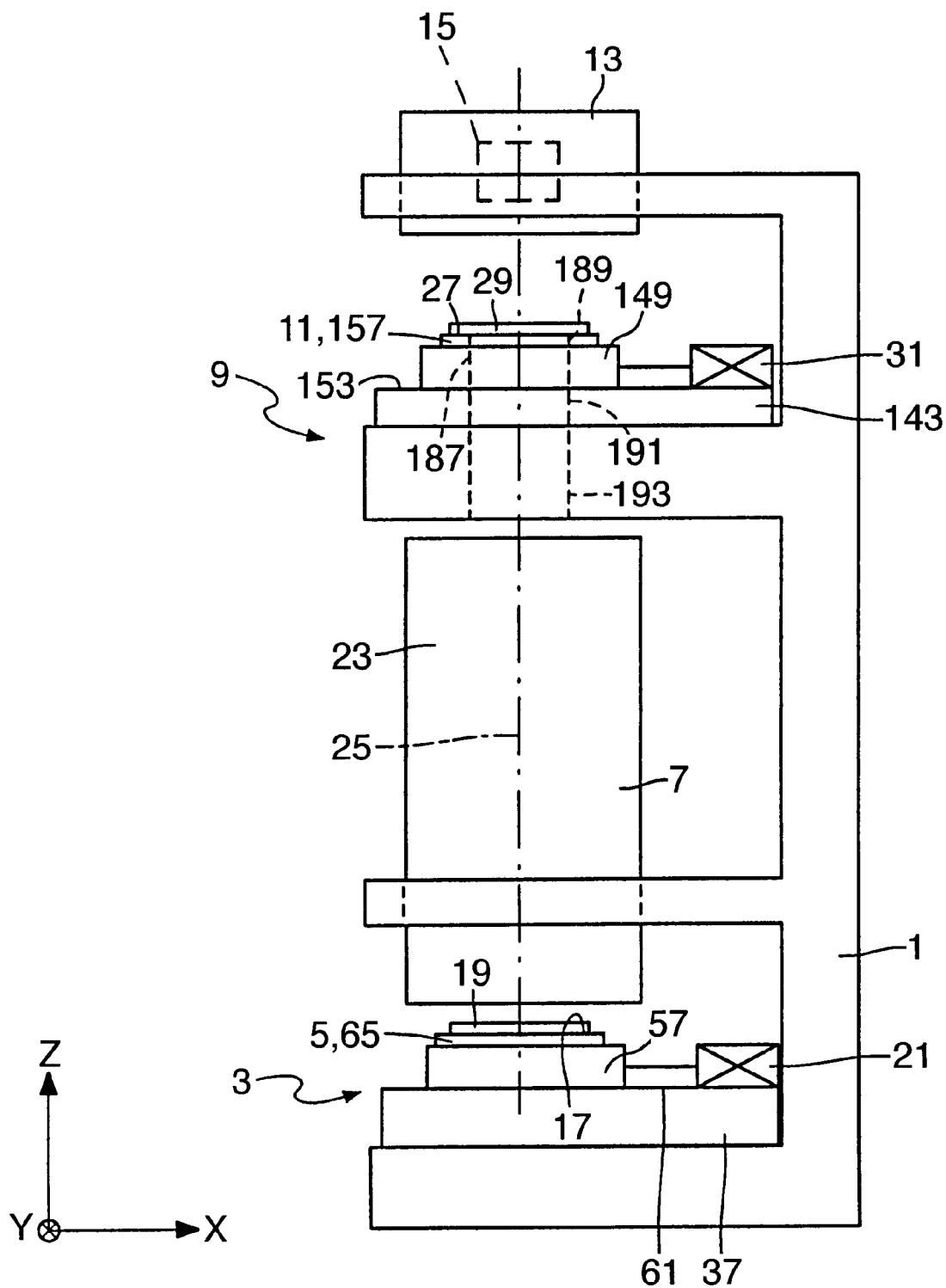
FIG. 1 shows a lithographic device, comprising a displaceable substrate holder and a displaceable mask holder, in accordance with a first embodiment of the invention.

FIG. 1 shows a lithographic device in accordance with the invention, which can be used in the manufacture of integrated semiconductor circuits by means of an optical lithographic process and an imaging method in accordance with the so-called "step-and-scan" principle. As shown in FIG. 1, the lithographic device comprises a frame 1 which, viewed parallel to a vertical Z-direction, successively supports a second object table, which includes a positioning device 3 and a substrate holder 5, a projection system 7, a first object table which includes a further positioning device 9 and a mask holder 11, and a radiation system 13. The lithographic device shown in FIG. 1 is an optical lithographic device in which the radiation system 13 includes a radiation source 15. The substrate holder 5 includes a supporting surface 17, which extends at right angles to the Z-direction, on which, in operation, a predominantly disc-shaped semiconductor substrate 19 can be held in a position perpendicular to the Z-direction. A drive unit 21 of the positioning device 3, which drive unit will be described in greater detail below, can be used to move the substrate holder 5 relative to the projection system 7 in mutually orthogonal X-, Y- and Z-directions.

The projection system, or focusing unit, 7 is an imaging system and comprises an optical lens system 23 having an optical axis 25 directed parallel to the Z-direction, and an optical reduction factor of, for example, 4 or 5. The mask holder 11 includes a supporting surface 27 which extends at right angles to the Z-direction, on which, in operation, a mask 29 can be held in a position perpendicular to the Z-direction. The mask 29 has a pattern or a subpattern of an integrated semiconductor circuit. The mask holder 11 can be displaced relative to the projection system 7 in at least the X-direction by means of a drive unit 31 of the further positioning device 9, which drive unit is only diagrammatically shown in FIG. 1.

In operation, a radiation beam originating from the source 15 is passed through (or reflected from) the mask 29 and focused by means of the lens system 23 on the semiconductor substrate 19. The semiconductor substrate 19 has a large number of separate fields on which identical semiconductor circuits can be provided. To this end, the fields of the semiconductor substrate 19 are successively exposed via the mask 29. During exposure of an individual field of the semiconductor substrate 19, the substrate holder 5 with the semiconductor substrate 19, and the mask holder 11 with the mask 29, are synchronously displaced relative to the projection system 7 in the X-direction by means of, respectively, the positioning device 3 and the further positioning device 9, so that the pattern or sub-pattern present on the mask 29 is scanned.

Each time an individual field of the semiconductor substrate 19 has been exposed, a subsequent field of the semiconductor substrate 19 is positioned relative to the projection system 7 by moving the substrate holder 5 with the semiconductor substrate 19 by means of the positioning device 3 in the X-direction and/or the Y-direction. This process is repeated a number of times with a different mask each time, so that complicated integrated semiconductor circuits having a laminated structure are obtained.

The integrated semiconductor circuits to be manufactured by means of the lithographic device have a structure with detail dimensions in the sub-micron range. Since the semiconductor substrate 19 is successively exposed via a number of different masks, the patterns present on the masks must be successively imaged onto the semiconductor substrate 19 with an accuracy which is also in the sub-micron range, or even in the nanometer range. To achieve this, between two successive exposure steps, the substrate holder 5 must be positioned with comparable accuracy relative to the projection system 7, and during an exposure step, also the substrate holder 5 and the mask holder 11 must be synchronously displaced relative to the projection system 7 with a comparable accuracy. Consequently, the positioning accuracy of the positioning device 3 and of the further positioning device 9 must meet very high requirements.

Figure 2:
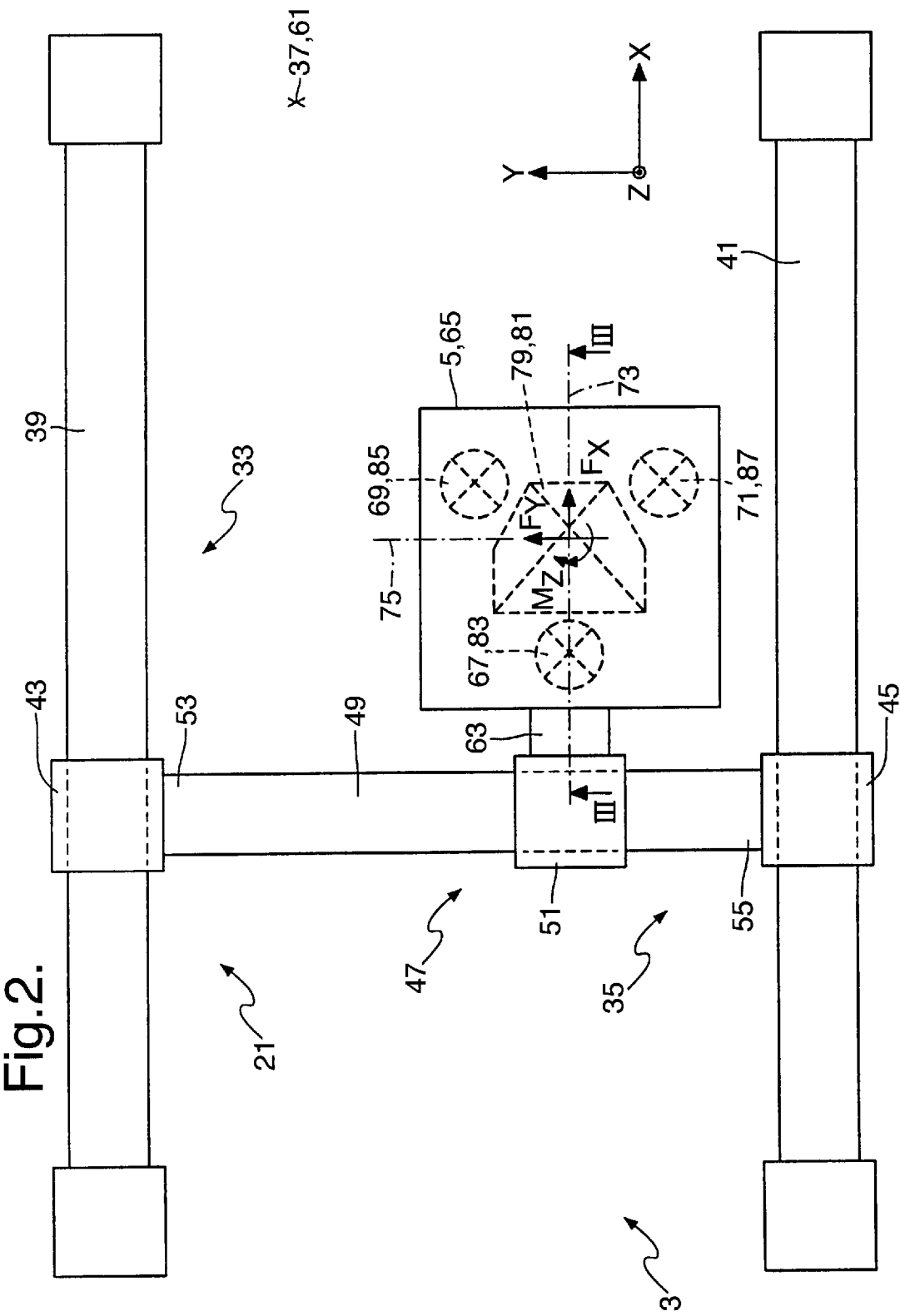
FIG. 2 is a plan view of a positioning device in accordance with the invention, for the substrate holder of the lithographic device shown in FIG. 1.

As shown in FIG. 2, the drive unit 21 of the positioning device 3 in accordance with the invention comprises two linear X-motors 33, 35 which each comprise a stator 39, 41 which extends parallel to the X-direction and is secured to a base 37 of the positioning device 3, and a translator 43, 45 which can be moved along the stator 39, 41. The base 37 is secured to the frame 1 of the lithographic device. The drive unit 21 further comprises a linear Y-motor 47 which includes a stator 49 which extends parallel to the Y-direction, and a translator 51 which can be moved along the stator 49. The stator 49 is secured, near a first end 53, to the translator 43 of the linear X-motor 33 and, near a second end 55, to the translator 45 of the linear X-motor 35.

Figure 3:
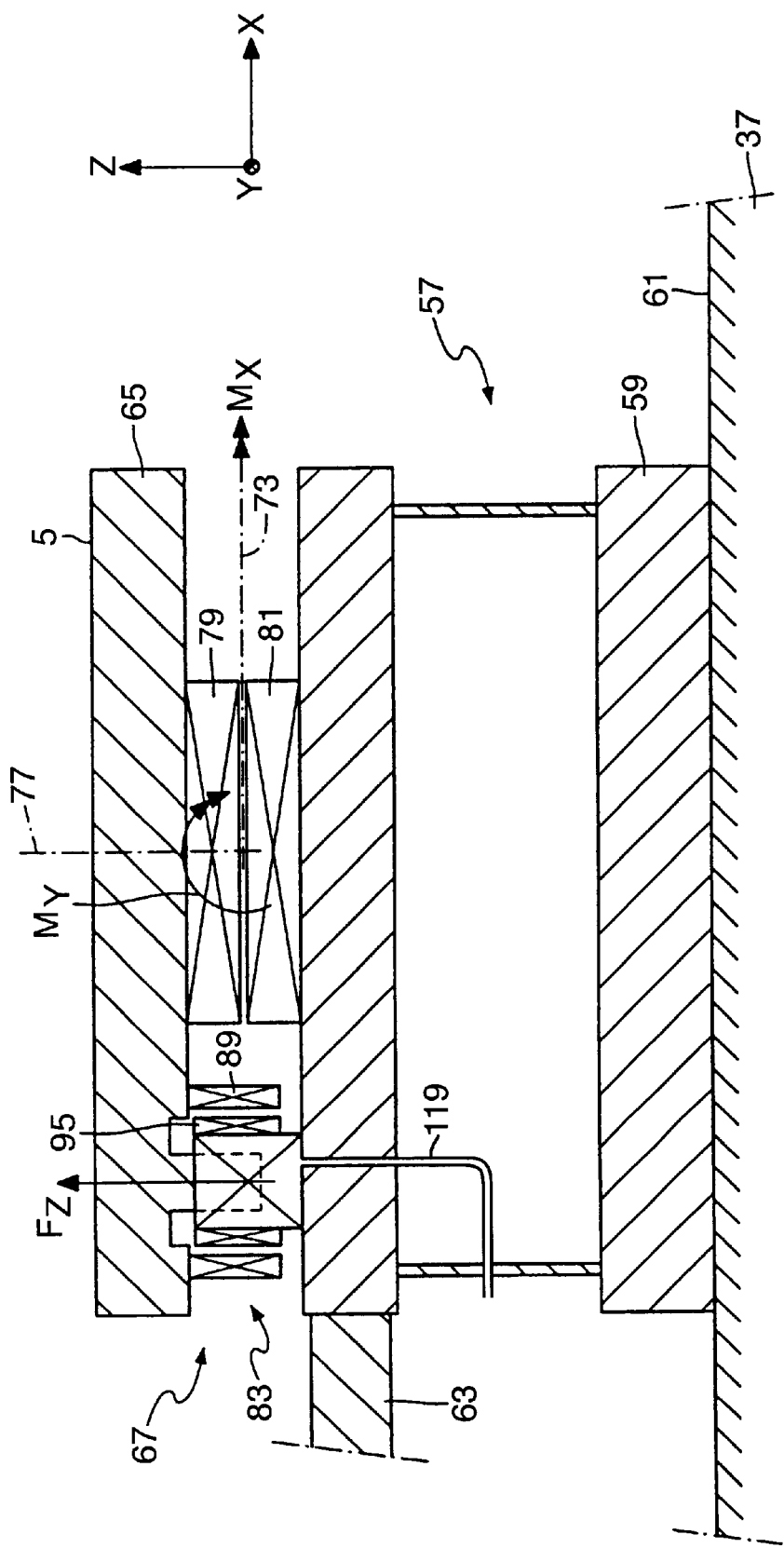
FIG. 3 is a sectional view taken on the line III—III in FIG. 2.

As shown in FIG. 3, the positioning device 3 further includes a first part 57 that is provided with a so-called air foot 59. The air foot 59 comprises a gas bearing (not shown in the Figure for simplicity's sake) by means of which the first part 57 is guided so as to be movable over a guide surface 61 of the base 37 extending at right angles to the Z-direction.

As shown in FIGS. 2 and 3, the first part 57 is coupled via a coupling member 63 to the translator 51 of the linear Y-motor 47. The positioning device 3 further includes a second part 65 to which the substrate holder 5 of the lithographic device is secured. The second part 65 is supported relative to the first part 57 in the vertical Z-direction by means of three supporting units 67, 69, 71, which will be described in greater detail below. It can be displaced relative to the first part 57 in the X-, Y- and Z-directions by means of a system of Lorentz-force motors 79, 81, 83, 85, 87, and can be rotated about first, second and third axes of rotation 73, 75, 77 respectively parallel to the X-, Y- and Z-directions by means of said system of Lorentz-force motors. For this purpose, the system of Lorentz-force motors 79, 81, 83, 85, 87 comprises a system of permanent magnets 79, only diagrammatically shown in FIGS. 2 and 3, which is secured to the second part 65, and a system of electric coils 81, which is secured to the first part 57, for generating a Lorentz-force Fx which is parallel to the X-direction, a Lorentz-force Fy which is parallel to the Y-direction, and a Lorentz-force torque Mz about the third axis of rotation 77.

The system of Lorentz-force motors 79, 81, 83, 85, 87 further includes three Z-Lorentz-force motors 83, 85, 87, which are only diagrammatically shown in FIGS. 2 and 3, and which each belong to one of the three supporting units 67, 69, 71, respectively. The Z-Lorentz-force motors 83, 85, 87 also each include a system of permanent magnets 89, which is secured to the second part 65, and a system of electric coils 95 which is secured to the first part 57. Each of the three Z-Lorentz-force motors 83, 85, 87 generates a Lorentz-force Fz which is parallel to the Z-direction, and they jointly generate a Lorentz-force torque Mx about the first axis of rotation 73, and a Lorentz-force torque My about the second axis of rotation 75.

The linear X-motors 33, 35 and the linear Y-motor 47 of the drive unit 21 are of a relatively simple type with relatively large dimensions, so that the first part 57 can be displaced over relatively large distances and with a relatively low accuracy relative to the base 37 by means of the drive unit 21 in the X-direction and the Y-direction. During such displacements of the first part 57, the second part 65 is held in position relative to the first part 57 by means of appropriate Lorentz forces of the system of Lorentz-force motors 79, 81, 83, 85, 87, while the second part 65 can also be displaced over relatively small distances and with relatively high accuracy with six degrees of freedom relative to the first part 57 by means of the system of Lorentz-force motors 79, 81, 83, 85, 87. Consequently, the positioning device 3 constitutes a two-stage positioning device having a coarse stage and a fine stage (long stroke and short stroke).

Figure 4:
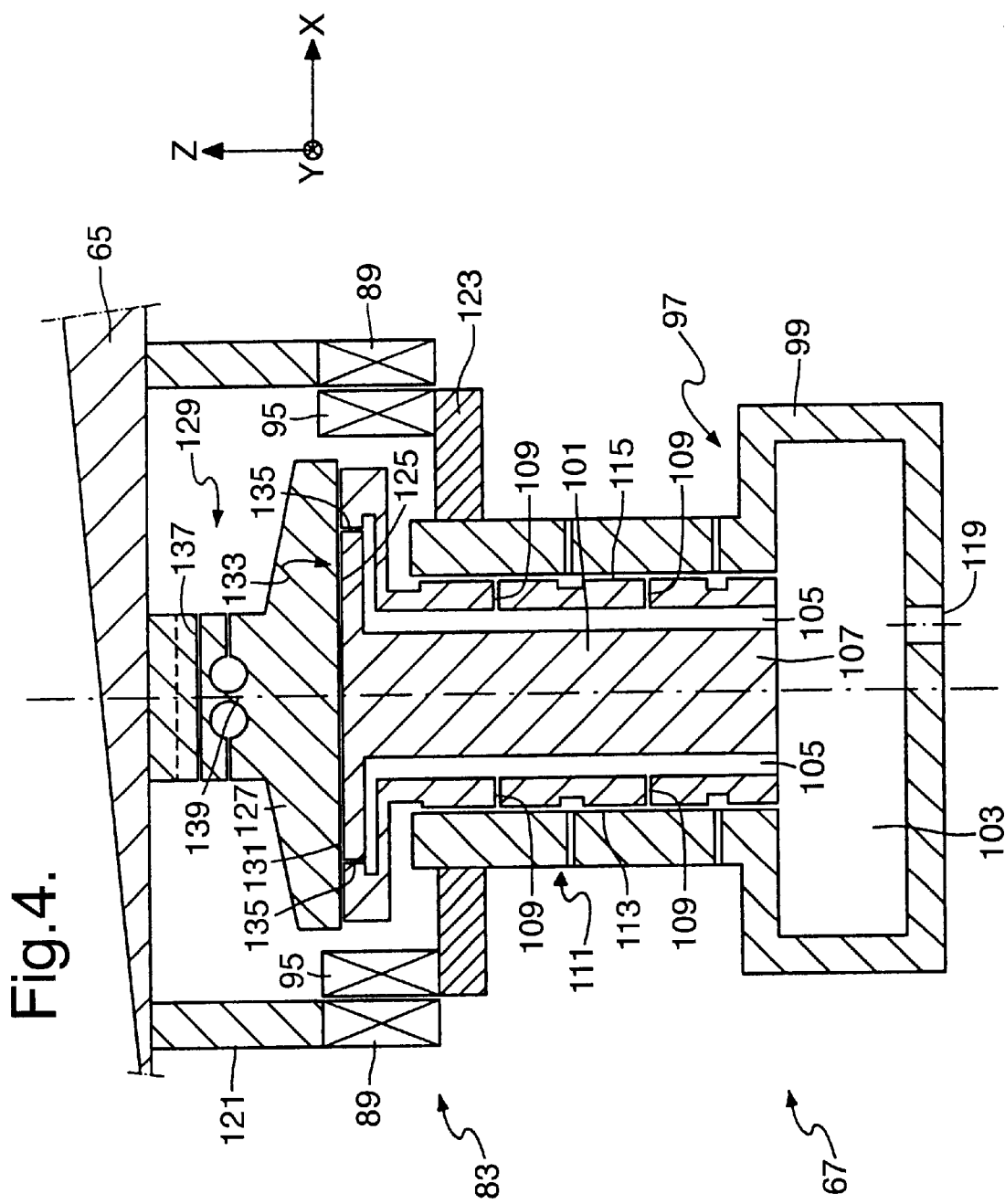
FIG. 4 is a sectional view of a supporting unit of the positioning device in accordance with FIG. 2.

FIG. 4 shows in more detail the supporting unit 67 of the positioning device 3. The supporting units 69 and 71 are substantially identical to the supporting unit 67. As shown in FIG. 4, the supporting unit 67 comprises a gas cylinder 97 which is provided with a housing 99, which is secured to the first part 57, and a piston 101, which is coupled to the second part 65. In the housing 99, there is a pressure chamber 103 in which the piston 101 is guided so as to be displaceable in a direction parallel to the Z-direction.

The piston 101 comprises a number of gas channels 105 that are in communication with the pressure chamber 103 near a bottom portion 107 of the piston 101. A static gas bearing 111 is connected to the gas channels 105 via a number of side channels 109, which gas bearing is situated between an inner wall 113 of the pressure chamber 103 and an outer wall 115 of the piston 101. The piston 101 is journaled relative to the housing 99 in a direction perpendicular to the Z-direction by means of the static gas bearing 111.

In this manner, the second part 65 is supported in the vertical Z-direction, relative to the first part 57 by a pneumatic supporting force which is determined by gas pressure present in the pressure chamber 103 of the gas cylinders 97 of the three supporting units 67, 69, 71. It is therefore unnecessary to support the second part 65 against gravity in the vertical Z-direction by Lorentz forces of the Z-Lorentz-force motors 83, 85, 87, which would lead to a high energy dissipation in the coils 95 of the Z-Lorentz-force motors 83, 85, 87. In the positioning device 3, the Lorentz-force-motors 83, 85, 87 are consequently only used to generate displacements of the second part 65 relative to the first part 57 in the Z-direction, and to generate rotations of the second part 65 relative to the first part 57 directed about the first axis of rotation 73 and directed about the second axis of rotation 75, so that the energy dissipation of the system of electric coils 95 of the Z-Lorentz-force motors 83, 85, 87 is reduced considerably.

Since the force generated by the gas cylinder remains essentially constant irrespective of piston position in the Z-direction, the gas cylinder behaves like a spring with zero stiffness. The natural frequency of the suspended mass/ "spring" system is essentially zero. As a result of this relatively low natural frequency, transmission of mechanical vibrations in the Z-direction, from the first part 57 to the second part 65 and the substrate holder 5 is precluded as much as possible. Mechanical vibrations may be present in the frame 1 of the lithographic device and may be caused by, for example, vibrations of the floor, reaction forces of the positioning devices 3 and 9, or acoustic vibrations. Transmission of such vibrations to the substrate holder 5 would lead to undesirable inaccuracies of the position of the substrate holder 5 relative to the focusing unit 7.

Since the piston 101 is journaled relative to the housing 99 perpendicular to the Z-direction by means of the static gas bearing 111, the piston 101 can be moved in the Z-direction substantially without friction, so that the relatively small pneumatic stiffness of the gas cylinder 97 is substantially not influenced by frictional forces of the static gas bearing 111 exerted on the piston 101. As a result thereof, the positioning device 3 in accordance with the invention has a relatively high positioning accuracy by using the gas cylinders 97. It is noted also that substantially no mechanical vibrations are transmitted from the first part 57 to the second part 65 via the system of Lorentz-force motors 79, 81, 83, 85, 87, because there is no mechanical contact between the systems of permanent magnets 79, 89 and the system of electric coils 81, 95, and because Lorentz-force motors supply a Lorentz force which does not change substantially in the case of relatively small displacements of the systems of permanent magnets 79, 89 relative to the systems of electric coils 81, 95.

As mentioned above, the three Z-Lorentz-force motors 83, 85, 87 each belong to one of the three supporting units 67, 69, 71, respectively, the three gas cylinders 97 each forming a supporting unit 67, 69, 71 with one of the Z-Lorentz-force motors. As shown in FIG. 4, the system of permanent magnets 89 of the Z-Lorentz-force motor 83 is secured to the second part 65 by means of a coupling member 121, which is only schematically shown, and which is substantially undeformable at least in the Z-direction. The system of electric coils 95 of the Z-Lorentz-force motor 83 is secured to the housing 99 of the gas cylinder 97 via a securing member 123. In this manner, a practical and compact construction of the positioning device 3 is obtained, the three gas cylinders 97 providing for a stable and statically determined support (against gravity) of the second part 65 relative to the first part 57, in the vertical Z-direction.

As is further shown in FIG. 4, the piston 101 is provided with a supporting surface 125 extending at right angles to the Z-direction. The supporting unit 67 of the positioning device 3 is further provided with an intermediate part 127 which is secured to the second part 65 by means of an elastically deformable connecting member 129. The intermediate part 127 includes a guide surface 131, which also extends at right angles to the Z-direction, and which bears on the supporting surface 125 of the piston 101 via a further static gas bearing 133. As shown in FIG. 4, the further static gas bearing 133, just like the static gas bearing 111, is connected via a number of side channels 135 to the gas channels 105 which are provided in the piston 101 and communicate with the pressure chamber 103.

The connecting member 129 is substantially undeformable in the Z-direction and includes a first elastic hinge 137, which extends in the X-direction, and a second elastic hinge 139, which extends in the Y-direction. The use of the two elastic hinges 137 and 139 enables the intermediate part 127 to be bent through limited angles relative to the second part 65 about two mutually perpendicular bending axes which are perpendicular to the Z-direction, so that the second part 65 can be rotated through limited angles relative to the first part 57 about the first axis of rotation 73 and the second axis of rotation 75. Since the connecting members 129 of the three supporting units 67, 69, 71 are substantially undeformable in the Z-direction, the second part 65 is supported relative to the pistons 101 of the three supporting units 67, 69, 71 in the Z-direction by the further static gas bearings 133. The second part 65 is guided over the supporting surfaces 125 substantially without friction in directions at right angles to the Z-direction, by means of the further static gas bearings 133. Movement of the second part 65 is thus rendered independent of the support units 67, 69, 71, and only determined by the Lorentz motors.

By using the connecting member 129 with the two elastic hinges 137 and 139, the second part 65 has freedom to rotate, relative to the first part 57, about the first and second axes of rotation 73, 75.

Figure 5:
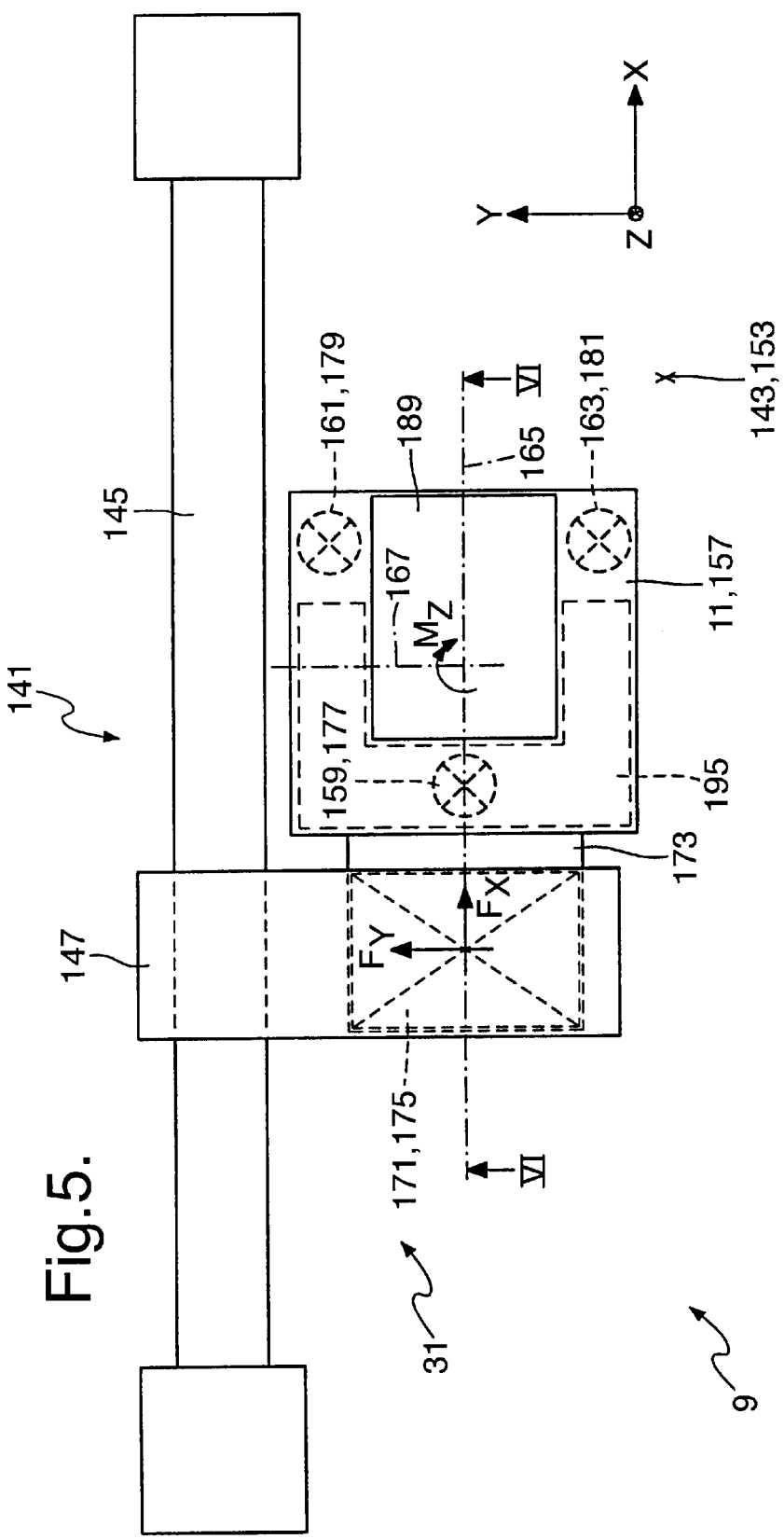
FIG. 5 is a plan view of a further positioning device in accordance with a second embodiment of the invention.
Figure 6:
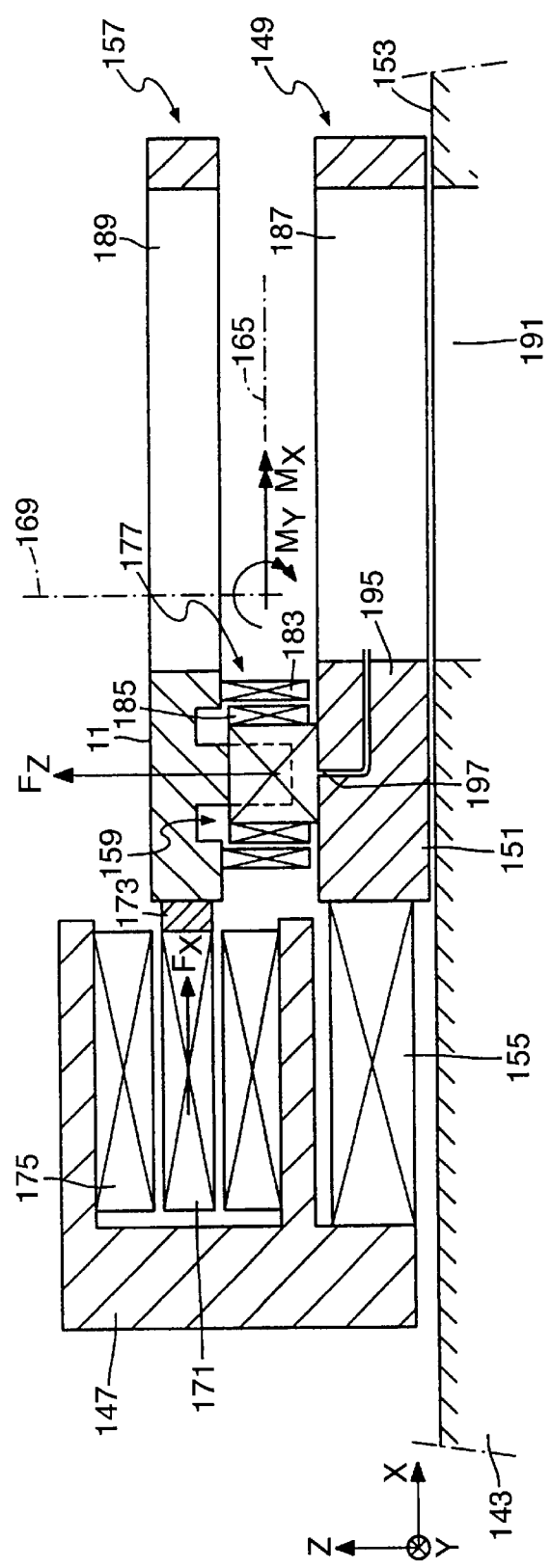
FIG. 6 is a sectional view taken on the line VI—VI in FIG. 5.

As shown in FIG. 5, the drive unit 31 of the further positioning device 9 in accordance with the invention comprises a linear X-motor 141 including a stator 145 which extends parallel to the X-direction and is secured to a base 143 of the further positioning device 9, and a translator 147 which can be displaced along the stator 145, the base 143 being secured to the frame 1 of the lithographic device. As shown in FIG. 6, the further positioning device 9 comprises a first part 149 that is provided with an air foot 151. The air foot 151 includes, just like the air foot 59 of the positioning device 3, a static gas bearing (not shown in the Figure for simplicity's sake) by means of which the first part 149 is guided so as to be displaceable over a guide surface 153 of the base 143, which guide surface extends at right angles to the Z-direction. As shown in FIG. 6, the first part 149 is coupled via a coupling member 155 to the translator 147 of the linear X-motor 141.

The further positioning device 9 further includes a second part 157 to which the mask holder 11 of the lithographic device is secured. The second part 157 is supported relative to the first part 149 in the vertical Z-direction by means of three supporting units 159, 161, 163, which will be described in greater detail below, and said second part can be displaced, relative to the first part 149, in the X, Y and Z-directions, and can be rotated about a first, second and third axes of rotation 165, 167, 169, respectively parallel to the X, Y and Z-directions, by means of said system of Lorentz-force motors.

To this end, the system of Lorentz-force motors 171, 175, 177, 179, 181 comprises a system of permanent magnets 171, only diagrammatically shown in FIGS. 5 and 6, which is secured to the second part 157 via a coupling member 173, and a system of electric coils 175 which is secured to the translator 147 of the linear X-motor 141, to generate Lorentz forces Fx and Fy respectively parallel to the X and Y-directions, and a Lorentz-force torque Mz which is directed about the third axis of rotation 169. The system of Lorentz-force motors 171, 175, 177, 179, 181 further includes three Z-Lorentz-force motors 177, 179, 181, which are only diagrammatically shown in FIGS. 5 and 6, and which each belong to one of the three supporting units 159, 161, 163, respectively. The Z-Lorentz-force motors 177, 179, 181 also each include a system of permanent magnets 183, which is secured to the second part 157, and a system of electric coils 185, which is secured to the first part 149. The three Z-Lorentz-force motors 177, 179, 181 each generate a Lorentz-force Fz, which is parallel to the Z-direction, and they jointly generate a Lorentz-force torque Mx, which is directed about the first axis of rotation 165, and a Lorentz-force torque My, which is directed about the second axis of rotation 167.

The linear X-motor 141 of the drive unit 31 is of a relatively simple type with relatively large dimensions, so that the first part 149 can be displaced in the X-direction over relatively large distances with relatively low accuracy relative to the base 143 by means of the drive unit 31. During such displacements of the first part 149, the second part 157 with the mask holder 11 is held in position relative to the first part 149 by appropriate Lorentz forces of the system of Lorentz-force motors 171, 175, 177, 179, 181, while the second part 157 with the mask holder 11 can also be displaced with six degrees of freedom relative to the first part 149 over relatively small distances with a relatively high accuracy by means of the system of Lorentz-force motors 171, 175. 177, 179, 181. Consequently, the further positioning device 9, just like the positioning device 3, constitutes a two-stage positioning device having a coarse stage and a fine stage (long stroke and short stroke).

Since the system of permanent magnets 171 and the system of electric coils 175 for generating the Lorentz-forces Fx and Fy and the Lorentz-force torque Mz are arranged in the translator 147 of the linear X-motor 141, that is beside the first part 149 and the second part 157, the first part 149 and the second part 157 can be provided with a necessary radiation passage 187, 189 for the radiation originating from the source 15, as shown in FIGS. 1, 5 and 6. Such a radiation passage 191, 193 is also provided in the base 143 of the further positioning device 9 and in the frame 1 of the lithographic device.

Embodiment 2

Figure 7:
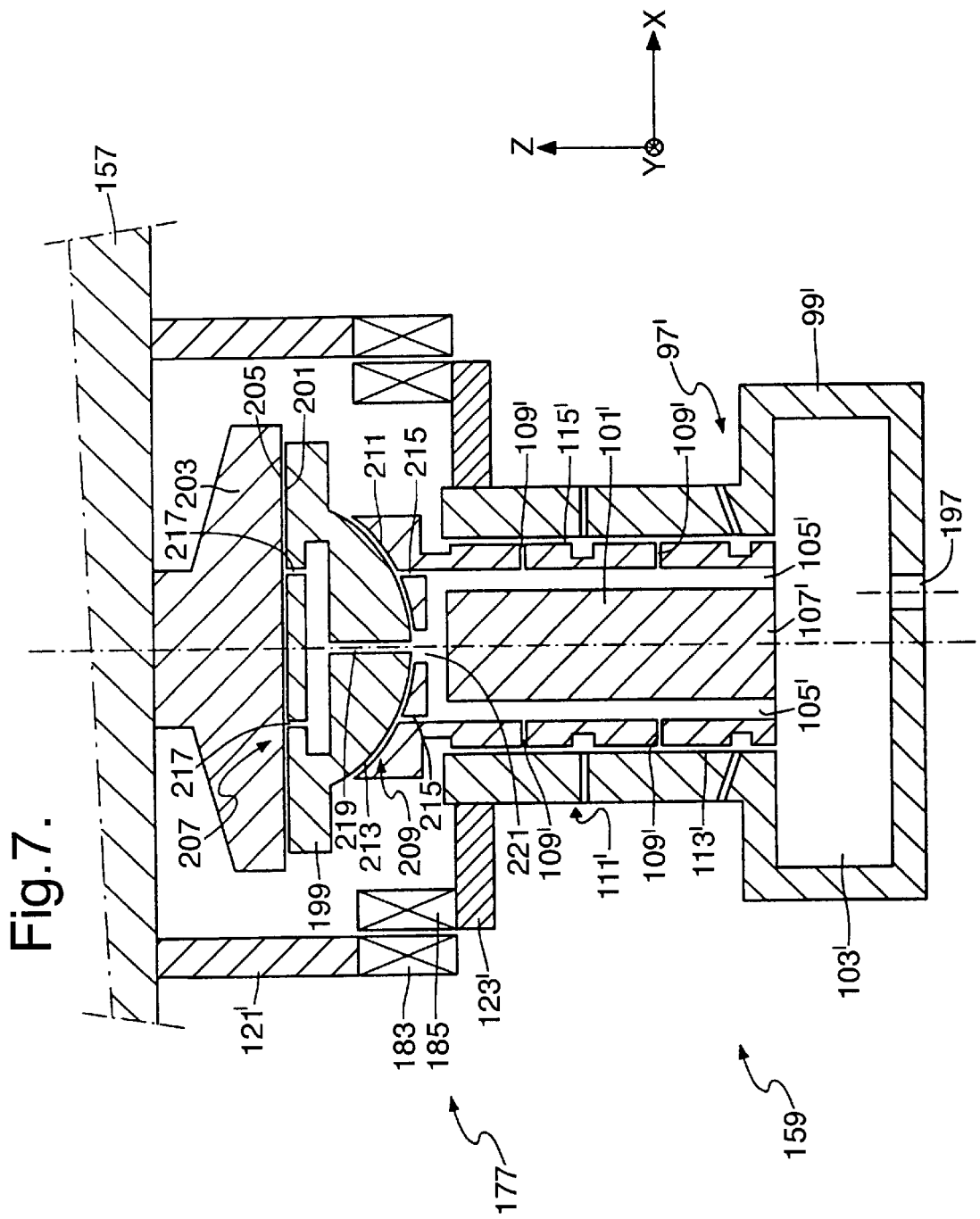
FIG. 7 is a sectional view of a supporting unit of the further positioning device in accordance with FIG. 5.

FIG. 7 is a detailed view of the supporting unit 159 of the further positioning device 9. The supporting units 161 and 163 are substantially identical to the supporting unit 159. In FIG. 7, parts of the supporting unit 159 corresponding to parts of the supporting unit 67 of the positioning device 3, as shown in FIG. 4, are indicated by corresponding reference numerals. In the following, only parts of the supporting unit 159 that differ from those used in the supporting unit 67 will be discussed.

The further positioning device 9 in accordance with the invention, like the positioning device 3, has a relatively high positioning accuracy by using the gas cylinders 97'. Just like the gas cylinders 97, the three gas cylinders 97' each form a supporting unit 159, 161, 163 with one of the Z-Lorentz-force motors 177, 179, 181, respectively, so that a practical and compact construction of the further positioning device 9 is obtained and a stable and statically determined support of the second part 157 and in the vertical Z-direction relative to the first part 149 is provided.

As shown in FIG. 7, the supporting unit 159 of the further positioning device 9 is provided with an intermediate part 199 on which a supporting surface 201 is provided, which extends perpendicularly to the Z-direction. A supporting member 203 is secured to the second part 157, which supporting member is provided with a guide surface 205 which also extends perpendicularly to the Z-direction, and which bears on the supporting surface 201 of the intermediate part 199 via a further static gas bearing 207. The intermediate part 199 is supported relative to the piston 101', in the Z-direction, by means of a spherical static gas bearing 209 which is present between a spherical upper side 211 of the piston 101' and a spherical lower side 213 of the intermediate part 199.

Just like the static gas bearing 111', the spherical static gas bearing 209 is connected via a number of side channels 215 to the gas channels 105' that are provided in the piston 101' and are in communication with the pressure chamber 103'. The further static gas bearing 207 is connected via a number of side channels 217 to a gas channel 219 which is provided in the intermediate part 199 and also communicates with the gas channels 105' via a gas passage 221 provided in the upper side 211 of the piston 101'. The use of the spherical static gas bearing 209 enables the intermediate part 199 to be rotated through limited angles relative to the piston 101' about two mutually perpendicular axes of rotation extending at right angles to the Z-direction, so that the second part 157 with the mask holder 11 can be rotated relative to the first part 149 through limited angles about the first axis of rotation 165 and the second axis of rotation 167.

The use of the further static gas bearing 207 enables the supporting member 203 to be guided substantially without friction over the supporting surface 201 of the intermediate part 199, so that the second part 157 with the mask holder 11 can be displaced relative to the first part 149 in the X and Y-directions, and rotated about the third axis of rotation 169.

Since the further static gas bearing 207, and the spherical gas bearing, are substantially without friction, movements of the second part 157 in X, Y, Rz, Rx, Ry are not influenced by the support units in any substantial way.

The static gas bearings can be supplied with gas (air) from a pressure chamber. Alternatively, use can be made of a separate, pressurized gas supply; in this way, changes in gas flow rate of the static bearing will not result in significant pressure fluctuations in the gas cylinder due to inertial or frictional effects.

Embodiment 3

Figure 8:
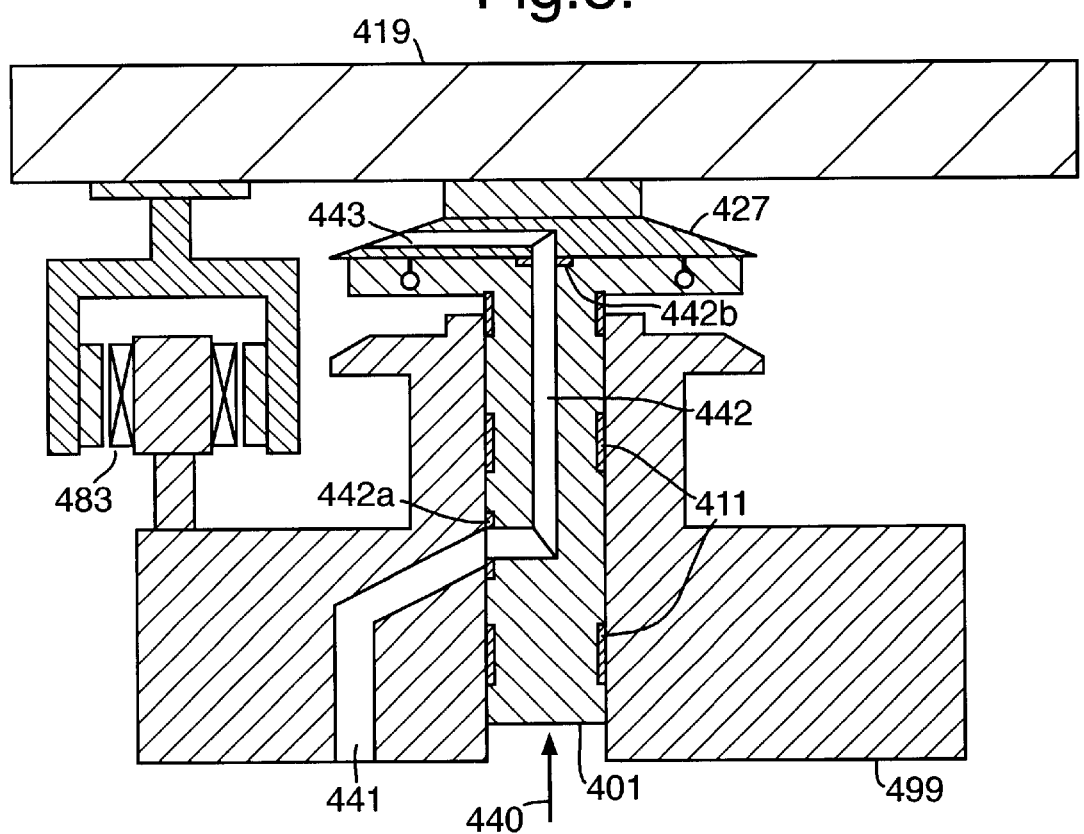
FIG. 8 is a diagram of a supporting unit in accordance with a third embodiment of the invention.

FIG. 8 is a diagrammatic cross-section of part of a positioning device according to a third embodiment of the present invention. Only the parts that differ from the first and second embodiments are shown and described below.

In the third embodiment, the substrate holder 419 is mounted upon a number of supporting units. The piston 401 of one such supporting unit is depicted here. Piston 401 is accommodated in a chamber in housing 499 and is journaled therein by static gas bearings 411 so as to be displaceable in the vertical Z-direction with insignificant friction. The weight of the substrate table 419 is borne by air pressure indicated by arrow 440, acting on the lower surface of piston 401. The vertical position of the substrate holder 419 is controlled by a number of Lorentz motors 483 (only one shown). This displacement and support mechanism provides all of the advantages of the first and second embodiments described above.

In the substrate holder 419, a (partial) vacuum is used to hold the substrate (not shown) in place during the exposure processes. In the third embodiment, a vacuum path from the substrate holder 419 to an external vacuum pump (not shown) is provided by vacuum conduits, 441, 442, 443. Conduit 441 passes through housing 499 and communicates with conduit 442 provided in piston 401. This in turn communicates with conduit 443 in intermediate member 427. Appropriate tubing (not shown) may be used to connect conduit 443 to appropriate points in the substrate holder 419. Enlargements 442A, 442B are provided at each end of conduit 442 to ensure that there is a vacuum connection throughout the allowed ranges of movement of piston 401 relative to housing 499 and substrate holder 419 relative to piston 401.

For proper functioning of embodiments of the present invention, it is preferable that the gravity compensator (e.g. piston 101) is acted upon by compressed air at a highly stable pressure; such pressure can be positive or negative (with a negative surface). FIG. 9 is a schematic diagram of a gas supply system that may be used in the invention to provide the desired pressurized gas. The gas may be air or any other suitable gas or mixture of gases.

In FIG. 9, 301 indicates the air supply which may be a gas bottle or a pumped source in which a large tank is filled by a pump. The large tank acts a capacitive filter to reduce pressure ripples from the pump. Whichever source is used, the output is controlled by regulator valve 302 which can be a single valve or a cascade of valves and can be either mechanical (passive) or electronic (e.g. piezoelectric, voice coil actuated, etc.) and servo controlled to a fixed reference level or an optimized, variable value, e.g. to minimize motor current. Such an arrangement will provide a substantially stable pressure, largely independent of flow rate. However, for use in the invention, further stabilization of the air supply is desirable.

To further regulate the air pressure, a large volume pre-chamber 303 is fed from the regulator valve 302. Pre-chamber 303 has a large volume compared to the actual volume of the gravity compensator, including both the main chamber 117 and cylinder 103. The pre-chamber 303, air supply 301 and regulator valve 302 may be situated at a relatively large distance from the actual object to be supported.

The compressed air is fed from the chamber 303 to the main chamber 117 via appropriate tubing. The inlet to the main chamber 117 is provided with a pneumatic resistor 304 that produces a pressure drop as a function of flow rate. The pneumatic resistor may be a frictional resistance such as a long capillary tube or an inertial resistance such as an orifice. Air from the main chamber 117 is fed to the piston 103 via tubing 305 which is made as short and smooth as possible, with minimal sharp turns, edges and other turbulence-creating features. This arrangement provides the equivalent of a resistance-capacitance circuit, forming a low pass filter to further reduce residual high-frequency pressure disturbances at the outlet of the regulator.

Embodiment 4

In the above-described lithographic device in accordance with the invention, use is made of an imaging method in accordance with the "step-and-scan" principle. It is noted that the invention also relates to lithographic devices in which, like in the lithographic device known from EP-A 0 498 496, an imaging method in accordance with the so-called "step-and-repeat" principle is used. In such a lithographic device in accordance with the invention, the substrate holder can be displaced between two exposure steps, by means of a positioning device in accordance with the invention, and the substrate holder and the mask holder are situated, during an exposure step, in fixed positions relative to the focusing unit.

A positioning device in accordance with the invention can be used, not only in a lithographic device, but also in other devices in which an object must be held in an accurate position or must be moved or positioned in an accurate manner by means of the positioning device. Examples of such devices include accurate processing machines or analytic equipment.

What is claimed is:

1. A positioning device, comprising:
   a first part;
   a second part, said second part to be moved relative to the first part by a Lorentz-force motor system and being supported relative to the first part in a Z-direction by at least one gas cylinder, said gas cylinder comprising a housing having a pressure chamber, said housing being coupled to the first part; and
   a piston coupled to the second part and which can be displaced in the pressure chamber in the Z-direction, said piston being journaled relative to said housing substantially at right angles to the Z-direction.

2. A positioning device according to claim 1, wherein said pressure chamber is connected to a main chamber of the gas cylinder which is provided in the first part.

3. A positioning device according to claim 1, wherein the second part is supported relative to the piston in the Z-direction by a static gas bearing, by means of which the second part is guided over a supporting surface of the piston so as to be displaceable substantially at right angles to the Z-direction.

4. A positioning device according to claim 1, wherein the first part can be displaced relative to a base of the positioning device, at least in the X-direction, by a drive unit of the positioning device.

5. A positioning device according to claim 1, wherein said piston is journaled relative to said housing by a static gas bearing.

6. A positioning device, comprising:
   a first part;
   a second part, said second part to be moved relative to the first part by a Lorentz-force motor system and being supported relative to the first part in a Z-direction by at least one gas cylinder, said gas cylinder comprising a housing having a pressure chamber, said housing being coupled to the first part; and
   a piston coupled to the second part and which can be displaced in the pressure chamber in the Z-direction, said piston being journaled relative to said housing substantially at right angles to the Z-direction,
   wherein the second part is supported relative to the piston in the Z-direction by a static gas bearing, by means of which the second part is guided over a supporting surface of the piston so as to be displaceable substantially at right angles to the Z-direction, and
   wherein the positioning device is provided with an intermediate part which is secured by an elastically deformable connecting member to the second part and bears on the supporting surface of the piston via said static gas bearing, the connecting member being substantially undeformable in the Z-direction and bendable about two mutually perpendicular bending axes which are substantially perpendicular to the Z-direction.

7. A positioning device, comprising:
   a first part;
   a second part, said second part to be moved relative to the first part by a Lorentz-force motor system and being supported relative to the first part in a Z-direction by at least one gas cylinder, said gas cylinder comprising a housing having a pressure chamber, said housing being coupled to the first part; and
   a piston coupled to the second part and which can be displaced in the pressure chamber in the Z-direction, said piston being journaled relative to said housing substantially at right angles to the Z-direction,
   wherein the second part is supported relative to the piston in the Z-direction by a static gas bearing, by means of which the second part is guided over a supporting surface of the piston so as to be displaceable substantially at right angles to the Z-direction, and
   wherein the positioning device comprises an intermediate part which is provided with the supporting surface and is supported relative to the piston by a spherical, static gas bearing in a direction substantially parallel to the Z-direction.

8. A positioning device, comprising:
   a first part;
   a second part, said second part to be moved relative to the first part by a Lorentz-force motor system and being supported relative to the first part in a Z-direction by at least one gas cylinder, said gas cylinder comprising a housing having a pressure chamber, said housing being coupled to the first part; and
   a piston coupled to the second part and which can be displaced in the pressure chamber in the Z-direction, said piston being journaled relative to said housing substantially at right angles to the Z-direction,
   wherein the positioning device is provided with three gas cylinders and Z-Lorentz-force motors belonging to the system of Lorentz-force motors, each of the Z-Lorentz-force motors exerting, in operation, a Lorentz force on the second part in the Z-direction, each of the gas cylinders forming a supporting unit with a respective Z-Lorentz-force motor.

9. A positioning device, comprising:

a first part;

a second part, said second part to be moved relative to the first part by a Lorentz-force motor system and being supported relative to the first part in a Z-direction by at least one gas cylinder, said gas cylinder comprising a housing having a pressure chamber, said housing being coupled to the first part; and a piston coupled to the second part and which can be displaced in the pressure chamber in the Z-direction, said piston being journaled relative to said housing substantially at right angles to the Z-direction, wherein said system of Lorentz-force motors is capable of displacing said second part relative to the first part in said Z-direction, and in X- and Y-directions which are mutually orthogonal and orthogonal to said Z-direction, and to rotate said second part relative to said first part about first, second and third axes of rotation respectively substantially parallel to said X-, Y- and Z-directions.

10. A positioning device, comprising:

a first part;

a second part, said second part to be moved relative to the first part by a Lorentz-force motor system and being supported relative to the first part in a Z-direction by at least one gas cylinder, said gas cylinder comprising a housing having a pressure chamber, said housing being coupled to the first part; and a piston coupled to the second part and which can be displaced in the pressure chamber in the Z-direction, said piston being journaled relative to said housing substantially at right angles to the Z-direction, wherein the Lorentz-force motors each comprise a system of permanent magnets secured to one of the first and second parts and a system of electric coils secured to the other one of the first and second parts.

11. A lithographic projection apparatus comprising:

a radiation system constructed and arranged to supply a projection beam of radiation;

a first moveable object table provided with a mask holder;

a second movable object table provided with a substrate holder; and a projection system constructed and arranged to image an irradiated portion of a mask held by said mask holder onto a target portion of a substrate held by said substrate holder, wherein at least one of said first and second movable object tables includes a positioning device comprising:

a first part;

a second part said second part to be moved relative to the first part by a Lorentz-force motor system and being supported relative to the first part in a Z-direction by at least one gas cylinder, said gas cylinder comprising a housing having a pressure chamber, said housing being coupled to the first part; and a piston coupled to the second part and which can be displaced in the pressure chamber in the Z-direction, said piston being journaled relative to said housing substantially at right angles to the Z-direction, at least one of said mask holder and said substrate holder being connected to said second part.

12. A method of manufacturing a device using a lithographic projection apparatus, said projection apparatus comprising:

a radiation system constructed and arranged to supply a projection beam of radiation;

a first movable object table provided with a mask holder;

a second movable object table provided with a substrate holder; and a projection system constructed and arranged to image irradiated portions of a mask held by said mask holder onto target portions of a substrate held by said substrate holder; the method comprising:

providing a substrate that is at least partially covered by a layer of radiation-sensitive material;

providing a mask that contains a pattern; and projecting an image of at least part of the mask pattern onto a target of the layer of radiation sensitive material, wherein during said projecting an image, at least one of the mask and the substrate is positioned using a positioning device comprising:

a first part;

a second part, said second part to be moved relative to the first part by a Lorentz-force motor system and being supported relative to the first part in a Z-direction by at least one gas cylinder, said gas cylinder comprising a housing having a pressure chamber, said housing being coupled to the first part; and a piston coupled to the second part and which can be displaced in the pressure chamber in the Z-direction, said piston being journaled relative to said housing substantially at right angles to the Z-direction.

13. A device manufactured according to the method of claim 12.

* * * * *